United States Patent [19]
Choi

[11] Patent Number: 5,305,282
[45] Date of Patent: Apr. 19, 1994

[54] ADDRESS INPUT BUFFER

[75] Inventor: Do-chan Choi, Seoul, Rep. of Korea

[73] Assignee: Samsung Electric Co., Ltd., Kyunggi-do, Rep. of Korea

[21] Appl. No.: 873,189

[22] Filed: Apr. 24, 1992

[30] Foreign Application Priority Data

Oct. 31, 1991 [KR] Rep. of Korea .................... 91-19331

[51] Int. Cl.$^5$ .................... G11C 17/00; H03K 3/286
[52] U.S. Cl. .................... 365/230.08; 365/230.02; 365/189.05; 307/279
[58] Field of Search .................... 365/230.08, 230.02, 365/189.05; 307/279

[56] References Cited

U.S. PATENT DOCUMENTS 4,031,415  6/1977  Redwine et al. ............... 365/230.08
5,157,284 10/1992  O'Connell et al. ............. 365/189.05
5,191,555  3/1993  Tabacco et al. ............... 365/230.08

Primary Examiner—Eugene R. LaRoche
Assistant Examiner—Son Dinh
Attorney, Agent, or Firm—Cushman, Darby & Cushman

[57] ABSTRACT

An address input buffer of a semiconductor memory device comprises an address input terminal, a column address switch, a row address switch, a column address latch connected to the column address switch, a row address latch connected to the row address switch, and an input buffer connected to the address input terminal, and the common node of the column address switch and the row address switch and controlled by an input buffer control signal. Thus, layout area can be reduced by buffering the row and column address input signals with one input buffer without separating the column and row address buffers.

9 Claims, 3 Drawing Sheets

ADDRESS INPUT BUFFER

BACKGROUND OF THE INVENTION

The present invention relates to a semiconductor memory device, and particularly to an address input buffer of a semiconductor memory device.

Generally, in a semiconductor memory device, an address input buffer is used for converting an address input data of a transistor-transistor logic (TTL) level into an address input data of a complementary metal-oxide semiconductor (CMOS) level, and increasing the noise margin. However, in a semiconductor memory device, as the capacity of the memory device increases, the number of addresses increases and twice as many address input buffers as addresses are necessary. Thus, the address input buffer ordinarily numbers twice that of the addresses; half are used as column address buffers and the rest as row address buffers. Therefore, the number of addresses is increased according to the increase in the capacity of the semiconductor memory device, and with more addresses comes more address input buffers, which brings about increased layout area.

SUMMARY OF THE INVENTION

The object of the present invention is to provide a new simplified address input buffer capable of decreasing layout area occupied by the address input buffer.

Another object of the present invention is to provide an improved address input buffer capable of improving an input characteristic.

To achieve the above objects, the address input buffer of the present invention comprises an address input terminal, a row address switching means, a column address switching means, a row address latch connected to the row address switching means, a column address latch connected to the column address switching means, and an input buffer connected to the address input terminal, and the common node of the row address switching means and the column address switching means and controlled by an input buffer control signal.

BRIEF DESCRIPTION OF THE DRAWINGS

The novel features believed characteristic of the invention are set forth in the appended claims; the invention itself, however, as well as other features and advantages thereof, may best be understood by referring to the following detailed description of particular embodiments when read in reference to the accompanying drawings, wherein:

DETAILED DESCRIPTION OF THE INVENTION

Before describing an address input buffer of the present invention, a conventional address input buffer will be described below with reference to the attached drawings.

Figure 1:
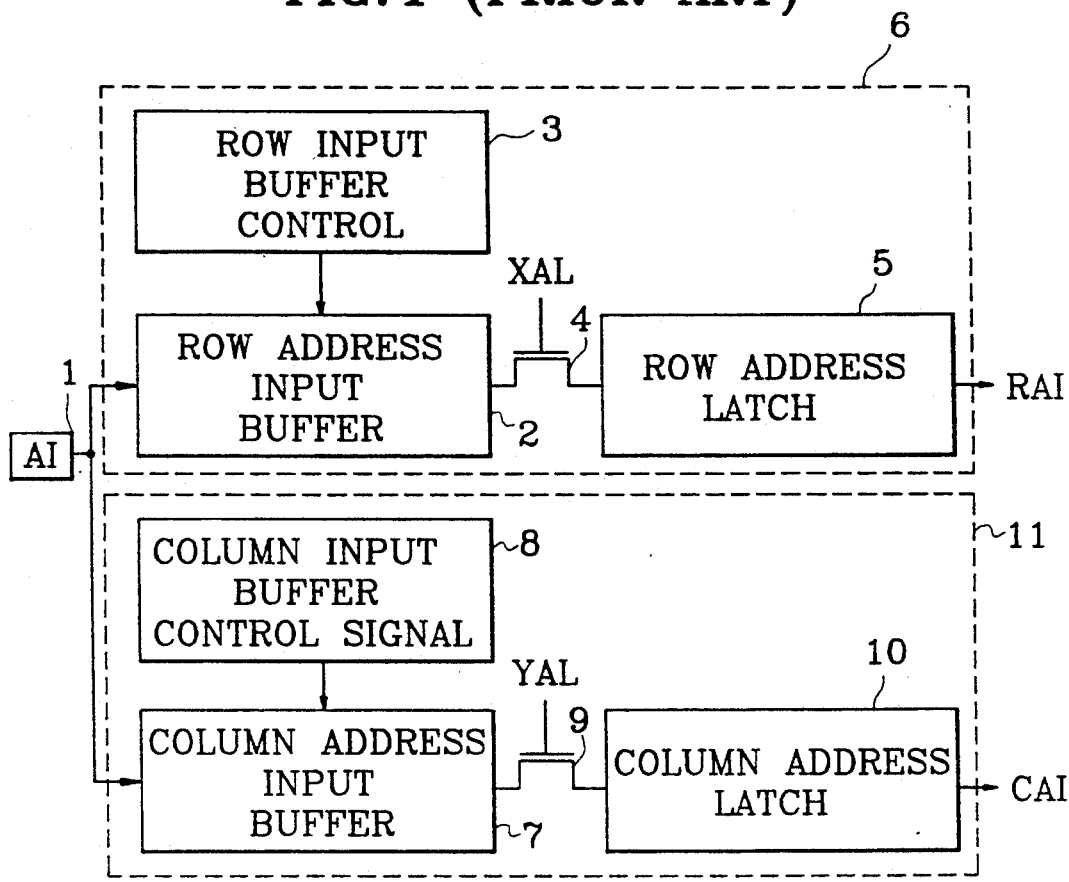
FIG. 1 shows a block diagram of a conventional address input buffer.

FIG. 1 shows a block diagram of a conventional address input buffer.

Referring to FIG. 1, the conventional address input buffer of a semiconductor memory device comprises row address generating means 6 and column address generating means 11. Row address generating means 6 comprises a row address input buffer 2 connected to address input terminal 1, row address input buffer control signal generating means 3 controlling row address input buffer 2, a row address switch transistor 4 switched by a row address latch signal XAL, and a row address latch 5 connected to the row address switch transistor 4, whereby generating a row address input signal RAI. Meanwhile, column address generating means 11 comprises a column address input buffer 7 connected to address input terminal 1, column address input buffer control signal generating means 8 for controlling column address input buffer 7, a column address switch transistor 9 switched by a column address latch signal YAL, and a column address latch 10 connected to the column address switch transistor 9, whereby generating a column address input signal CAI.

Accordingly, row address input buffer 2 and column address input buffer 7 are separated, which will increase the layout area during integration.

Figure 2:
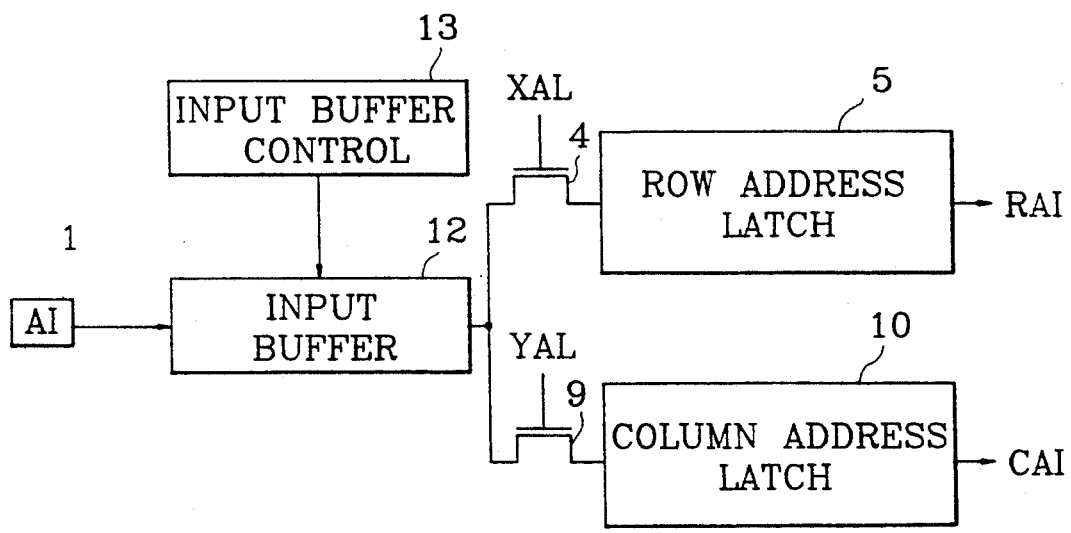
FIG. 2 shows a block diagram of an address input buffer according to the present invention.

FIG. 2 shows a block diagram of an address input buffer according to the present invention.

Referring to FIG. 2, this address input buffer comprises an address input terminal 1, an input buffer control signal generating means 13 controlling an input buffer 12 connected to address input terminal 1, a row address switch transistor 4 controlled by a row address latch signal XAL and connected to input buffer 12, a row address latch 5 connected to row address switch transistor 4 for outputting a row address input signal RAI, a column address switch transistor 9 controlled by a column address latch signal YAL and connected to input buffer 12, and a column address latch 10 connected to column address switch transistor 9 for outputting a row address input signal CAI.

Now, the operation according to the above structure will follow.

Input buffer 12 operates in response to a control signal from input buffer control signal generating means 13. Address data of a TTL level input from address input terminal 1 is converted into address data of a CMOS level through the input buffer.

With XAL active, row address latch 5 receives the output signal of the input buffer 12 through row address switch transistor 4 and outputs a row address input signal RAI. With YAL active, column address latch 10 receives the output signal of the input buffer 12 through column address switch transistor 9 and then outputs a column address input signal CAI. Here, when row address latch signal XAL is in the active state, column address latch signal YAL is not active, while column address latch signal YAL is active when row address latch signal XAL is not active.

Figure 3:
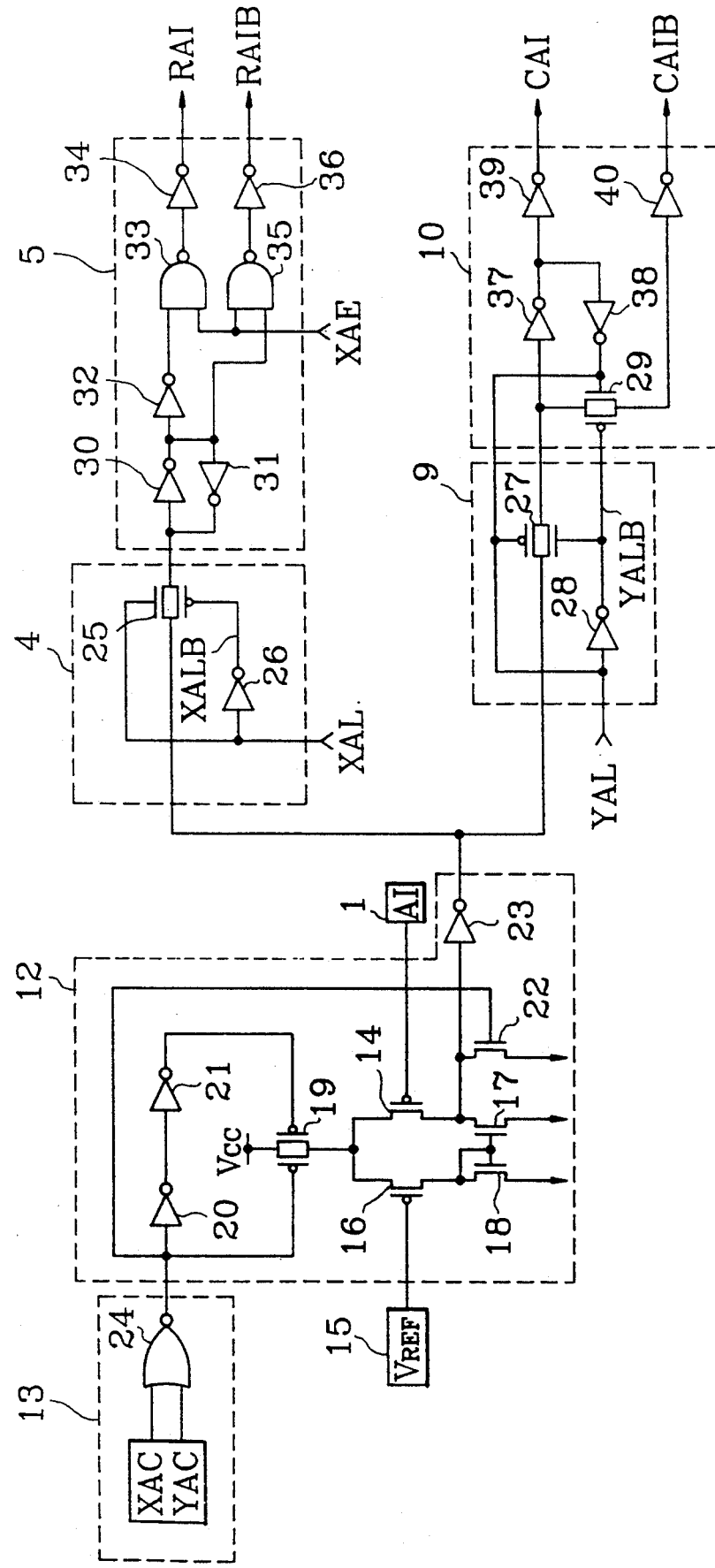
FIG. 3 is a circuit diagram illustrating an embodiment of the address input buffer shown in FIG. 2.

FIG. 3 shows an embodiment of the address input buffer in FIG. 2 according to the present invention.

In FIG. 3, input buffer 12 comprises PMOS transistor 14 having its control electrode connected to address input terminal 1, PMOS transistor 16 having its source electrode commonly connected to the source electrode of PMOS transistor 14 and its gate electrode is supplied with a constant voltage (Vref) 15, NMOS transistor 17 having its drain electrode coupled to the drain electrode of PMOS transistor 14 and its source electrode connected to a ground potential, NMOS transistor 18 having its drain electrode coupled to the drain electrode of PMOS transistor 16, its source electrode connected to the ground potential and its gate electrode commonly connected to its drain electrode and the gate electrode of NMOS transistor 17, two PMOS transistors 19 having drain electrodes coupled to the source electrodes of PMOS transistors 14 and 16 and source electrodes coupled to a power voltage Vcc, and inverter 20 having its input terminal coupled to one gate electrode of PMOS transistors 19, an inverter 21 having its output terminal coupled to the other gate electrode of PMOS transistors 19 its input terminal coupled to the output of first inverter 20, an NMOS transistor 22 having its gate electrode also connected to the input terminal of inverter 20, its drain electrode connected to the drain electrode of NMOS transistor 17 and its source electrode is connected to the ground potential, and an inverter 23 having its input terminal connected to the drain of NMOS transistor 22.

Input buffer control signal generating means 13 consists of a NOR gate 24 receiving a row address control signal XAC and a column address control signal YAC, and having its output terminal connected to the input terminal of inverter 20 of input buffer 12.

Row address switch transistor 4 consists of an inverter 26; and a CMOS transmission gate 25 including an NMOS transistor connecting a row address latch signal XAL to its gate electrode, and a PMOS transistor connecting an inverted row address latch signal XALB inverted through the inverter 26 to its gate electrode, and having its input side connected to the output of inverter 23.

Column address switch transistor 9 consists of an inverter 28; and a CMOS transmission gate 27 including a PMOS transistor connecting a column address latch signal YAL to its gate electrode, an NMOS transistor connecting an inverted column address latch signal YALB inverted through the inverter 28 to its gate electrode and having its input side also connected to the output of inverter 23.

Row address latch circuit 5 comprises an inverter 30 having its input terminal connected to the output side of transmission gate 25 of row address switch transistor 4, an inverter 31 having its input terminal connected to the output terminal of inverter 30 and its output terminal connected to the input of inverter 30, an inverter 32 having its input terminal connected to the output terminal of an inverter 30, a NAND gate 33 receiving an output signal of inverter 32 and a row address enable signal XAE, inverter 34 serially connected to the NAND gate 33 and then outputting a row address input signal RAI, a NAND gate 35 receiving an output signal of inverter 30 and row address enable signal XAE, and inverter 36 serially connected to the NAND gate 35 and then outputting an inverted row address input signal RAIB.

Column address latch circuit 10 comprises a CMOS transmission gate 29 having its input side coupled to the output side of CMOS transmission gate 27 and composed of an NMOS transistor having its gate electrode connected to column address latch signal YAL, a PMOS transistor having its gate electrode connected to inverted column address latch signal YALB inverted through inverter 28; an inverter 37 having its input terminal connected to the output side of CMOS transmission gate 27 of column address switch transistor 9; an inverter 38 having its input terminal connected to the output terminal of inverter 37 and its output terminal connected to a gate electrode of NMOS transistor of CMOS transmission gate 29; an inverter 39 having its input terminal connected to the output terminal of inverter 37 and outputting a column address input signal CAI, and an inverter 40 having its input terminal connected to the output side of CMOS transmission gate 29 and outputting an inverted column address input signal CAIB.

Figure 4:
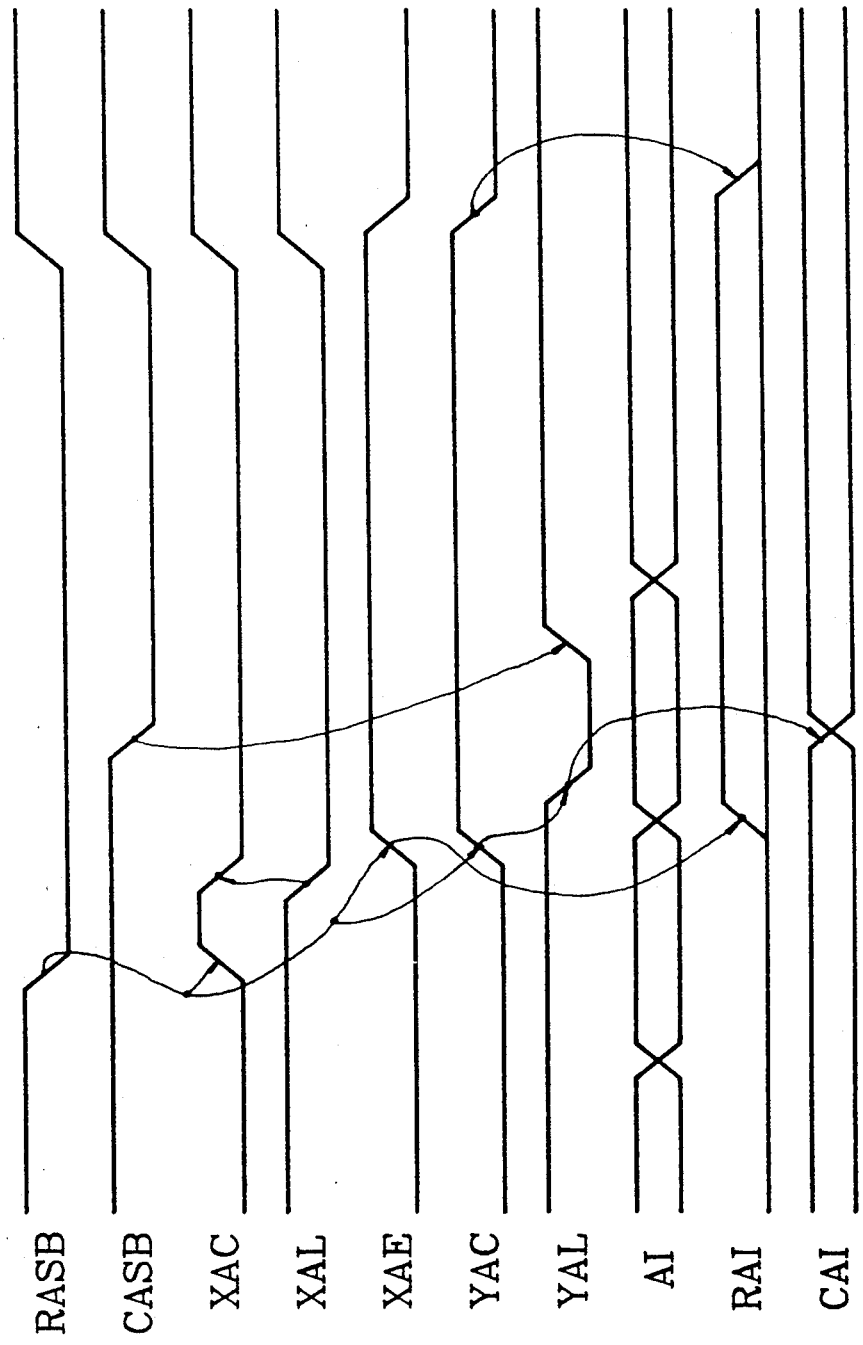
FIG. 4 shows a timing diagram explaining the operation of the circuit in FIG. 2.

Now, in reference with FIG. 4, the operation of the address input buffer constructed as above will be explained below. When an inverted row address strobe signal RASB is generated, column address control signal XAC goes high during the falling transition of inverted row address strobe signal RASB. Column address control signal YAC rises later than row address control signal XAC. When column address control signal YAC goes high, the output signal of NOR gate 24 goes low. Transmission gate 19 consisting of the two PMOS transistors turns on. At the same time, NMOS transistor 22 is turned off. Here, inverters 20 and 21 generate a delay to reduce the peak current generated when the two PMOS transistors are turned on.

Receiving constant voltage (Vref) 15 at its gate electrode, PMOS transistor 16 turns on and then its drain electrode goes high. When this logic "high" voltage is supplied to the gate electrodes of NMOS transistors 17 and 18, NMOS transistors 17 and 18 are turned on.

When a logic "high" address input from address input terminal 1 is received, PMOS transistor 14 is turned off and the drain electrode of NMOS transistor 17 goes low. If a logic "low" address input is received, PMOS transistor 14 is turned on and the drain electrode of NMOS transistor 17 goes high.

Inverter 23 inverts the signal of drain electrode of NMOS transistor 17 to generate bufferred address input signals. Thus, when receiving an address input signal of a TTL level, input buffer 12 generates an address input signal of a CMOS level.

In row address switch transistor 4, when row address latch signal XAL falls to a logic "low", row address control signal XAC also falls to a logic "low". When a logic "high" row column address latch signal XAL is received, CMOS transmission gate 25 transfers the output signal of inverter 23 to a latch circuit consisting of inverters 30 and 31. The latched signal is then inverted by inverter 32. Row address enable signal XAE goes high later than row address control signal XAC by an inverted row address strobe signal RASB. If the output signal of inverter 32 is in a logic "high" state when row address enable signal XAE is high, the output signal RAI of inverter 34 via NAND gate 33 goes high, and the output signal RAIB of inverter 36 via NAND gate 35 goes low. Column address control signal YAC goes high later than row address enable signal XAE when inverted row address strobe signal RASB goes low.

Input buffer 12 operates when column address control signal YAC is high. When a logic "high" column address input from address input terminal 1 is received, inverter 23 of input buffer 12 outputs a logic "high" signal. During a rising transition of column address control signal YAC, column address latch signal YAL is delayed from high to low. CMOS transmission gates 27 and 29 is turned on when column address latch signal YAL is low, so that inverters 37 and 39 output column address input signal CAI as a logic "high" and inverter 40 outputs inverted column address input signal CAIB as a logic "low". Column address latch signal YAL goes high when inverted column address strobe signal CASB falls to a logic "low". Row address input signal RAI and inverted row address input signal RAIB remain unchanged until row address enable signal XAE falls to a logic "low".

According to the prior art, in an address input buffer, when the number of addresses is N, N column address input buffers and N row address input buffers are required, meaning that 2N address input buffers are required. If an input buffer is laid out by design rule in a 64 Mbit-DRAM, 180,000 $\mu m^2$ is needed, because 26 address input buffers are required when assuming the area occupied by one address input buffer is 120×60 $\mu m^2$.

However, the address input buffer according to the present invention uses only N address input buffers by uniting column address input buffer and row address input buffer into an address input buffer, thereby reducing the layout area occupied by one address buffer by half. That is, in case of 64 Mbit-DRAMs, the area can be reduced to about 90,000 $\mu m^2$. Also, by controlling a column address and a row address with one input buffer, a row address input signal and a column address input signal having the same characteristics are obtained, thereby improving the characteristic of the overall integrated circuit.

What is claimed is:

1. An address input buffer in a semiconductor memory device comprising:

an address input terminal for receiving non-buffered row and column address signals;

input buffer means, connected to said address input terminal, for outputting a buffered column address signal when an input first control signal is in a first logic state and for outputting a buffered row address signal when an input second control signal is in a second logic state;

row address switching means for transmitting the buffered row address signal to a row address latch means in response to a first signal transmitting to the second logic state before the first control signal transits to the second logic state;

said row address latch means transmitting said buffered row address signal from said row address switching means, to an output terminal thereof, in response to a second signal transitting to the first logic state after said first signal has transitted to the second logic state;

column address switching means for transmitting said buffered column address signal to a column address latch means in response to a third signal transitting to the second logic state after said second control signal has transitted to the first logic state; and said column address latch means transmitting said buffered column address signal from said column address switching means, to an output terminal thereof, after and in response to said first signal having transitted to the second logic state and after said second signal has transmitted to the first logic state, such that said buffered column address signal is output from said column address latch means after said buffered row address signal is first output from said row address latch means.

2. An address input buffer as claimed in claim 1, wherein said input buffer means comprises:

a first PMOS transistor having a gate electrode coupled to said address input terminal;

a second PMOS transistor having a source electrode commonly connected to the source electrode of said first PMOS transistor and its gate electrode supplied with a constant voltage;

a first NMOS transistor having a drain electrode coupled to the drain electrode of said first PMOS transistor and a source electrode coupled to a ground potential;

a second NMOS transistor having a drain electrode coupled to the drain electrode of said second PMOS transistor, a source electrode coupled to a ground potential and a gate electrode commonly connected to its drain electrode and the gate electrode of said first NMOS transistor;

two third PMOS transistors having drain electrodes coupled to the source electrodes of said first and second PMOS transistors and source electrodes coupled to a supply voltage;

a first inverter having an input terminal connected the gate electrode of one of said third PMOS transistors;

a second inverter having an output terminal connected to the gate electrode in the other of said third PMOS transistors, and an input terminal coupled to the output terminal of said first inverter;

a third NMOS transistor having a gate electrode coupled to the input terminal of said first invertor, a drain electrode coupled to the drain electrode of said first NMOS transistor and a source electrode coupled to a ground potential; and a third invertor having an input terminal connected to the drain electrode of said third NMOS transistor.

3. An address input buffer as claimed in claim 2, wherein said input buffer means further comprises a logic means for receiving the first control signal and the second control signal, and for outputting said first logic state when one of the two signals is in the first logic state, said logic means including an output terminal connected to the input terminal of said first inverter.

4. An address input buffer as claimed in claim 3, wherein said row address switching means comprises:

a fourth inverter for inverting said first signal;

a first CMOS transmission gate including a fourth NMOS transistor connecting the first signal to the gate electrode thereof and a fourth PMOS transistor connecting its gate electrode to said first signal inverted by a fourth inverter, and in which its input terminal is connected to the output terminal of said third inverter.

5. An address input buffer as claimed in claim 4, wherein said row address latch means comprises:

a fifth inverter connected to the output terminal of said first transmission gate;

a sixth inverter having an input terminal connected to the output terminal of said fifth inverter and an output terminal coupled to the input terminal of said fifth inverter;

a seventh inverter having an input terminal connected to said fifth inverter;

a first NAND gate receiving the output of said seventh inverter and the second signal;

an eighth inverter connected to the output terminal of said first NAND gate for outputting the buffered row address signal;

a second NAND gate receiving the output of said fifth inverter and said second signal; and a ninth inverter connected to the output terminal of said second NAND gate for outputting an inverted state of said buffered state of said buffered row address signal.

6. An address input buffer as claimed in claim 5, wherein said column address switching means comprises:
 a tenth inverter for inverting said second signal; and
 a second CMOS transmission gate including a fifth PMOS transistor having a gate electrode receiving said third signal and a fifth NMOS transistor having a gate electrode receiving said third signal inverted by said tenth inverter.

7. An address input buffer as claimed in claim 6, wherein a column address latch circuit comprises:
 a third CMOS transmission gate including a sixth NMOS transistor having a gate electrode receiving said third signal and a sixth PMOS transistor having a gate electrode receiving said third signal inverted by said tenth inverter, and said third CMOS transmission gate having an input terminal connected to the output terminal of said second CMOS transmission gate;
 an eleventh inverter having its input terminal connected to an output side of the second CMOS transmission gate of said column address switching means;
 a twelfth inverter having an input terminal connected to an output of said eleventh inverter and an output terminal connected to a gate electrode of the sixth NMOS transistor of aid third CMOS transmission gate;
 a thirteenth inverter having an input terminal connected to an output terminal of said eleventh inverter for outputting the buffered column address signal; and
 a fourteenth inverter having an input terminal connected to an output terminal of said third CMOS transmission gate for outputting an inverted state of said buffered column address signal.

8. An address input buffer of a semiconductor memory device comprising:
 an address input terminal;
 a column address switching circuit;
 a row address switching circuit;
 a column address latch circuit connected to said column address switching circuit;
 a row address latch circuit connected to said row address switching circuit; and
 an input buffer connected to said address input terminal, and to a common node between inputs to said column address switching circuit and said row address switching circuit for selectively outputting, to said common node, buffered row and column address signals under the control of column and row address control signals, said input buffer comprising:
 a first PMOS transistor having a gate electrode connected to said address input terminal;
 a second PMOS transistor having a source electrode commonly connected to the source electrode of said first PMOS transistor and supplying constant voltage to its gate electrode;
 a first NMOS transistor having a drain electrode coupled to the drain electrode of said PMOS transistor and a source electrode connected to a ground potential;
 a second NMOS transistor having a drain electrode coupled to the drain electrode of said second PMOS transistor, a source electrode connected to the ground potential, and a gate electrode commonly connected to its drain electrode and the gate electrode of said first NMOS transistor;
 two third PMOS transistor s having drain electrodes coupled to the source electrodes of said first and second PMOS transistors and source electrodes coupled to a supply voltage;
 a first inverter having its input terminal coupled to the gate electrode of one of aid two third PMOS transistors;
 a second inverter having its input terminal coupled to an output terminal of said first inverter and having an output terminal connected to a gate electrode of the other of said two third PMOS transistors;
 a third NMOS transistor having a gate electrode connected to the input terminal of said first inverter and a drain electrode connected to the drain electrode of said first NMOS transistor; and
 a third inverter having an input terminal connected to the drain of said third NMOS transistor.

9. An address input buffer, responsive to row and column addresses from an address input terminal and control signals from control terminals, for selectively transmitting row address signals to a row address input buffer stage and for transmitting column address signals to a column address input buffer stage, said address input buffer comprising:
 a first PMOS transistor having a gate electrode connected to said address input terminal;
 a second PMOS transistor having a source electrode commonly connected to the source electrode of said first PMOS transistor and supplying constant voltage to its gate electrode;
 a first NMOS transistor having a drain electrode coupled to the drain electrode of aid PMOS transistor and a source electrode connected to a ground potential;
 a second NMOS transistor having a drain electrode coupled to the drain electrode of said second PMOS transistor, a source electrode connected to the ground potential, and a gate electrode commonly connected to its drain electrode and the gate electrode of said first NMOS transistor;
 two third PMOS transistors having drain electrodes coupled to the source electrodes of aid first and second PMOS transistors and source electrodes coupled to a supply voltage;
 a first inverter having its input terminal coupled to the gate electrode of one of said two third PMOS transistors;
 a second inverter having its input terminal coupled to the output terminal of said first inverter and its output terminal connected to the gate electrode of the other of said two third PMOS transistors;
 a third NMOS transistor having a gate electrode connected to the input terminal of said first inverter and a drain electrode connected to the drain electrode of said first NMOS transistor; and
 a third inverter having an input terminal connected to the drain of said third NMOS transistor.

* * * * *